(12) United States Patent
Stribley et al.

(10) Patent No.: US 6,933,551 B1
(45) Date of Patent: Aug. 23, 2005

(54) LARGE VALUE, COMPACT, HIGH YIELDING INTEGRATED CIRCUIT CAPACITORS

(75) Inventors: Paul Ronald Stribley, Plymouth (GB); Gary Charles Day, Plymouth (GB); Bo Goran Alestig, Gothenburg (SE)

(73) Assignee: Zarlink Semiconductor Limited, Swindon (GB)

( * ) Notice: Subject to any disclaimer, the term of this patent is extended or adjusted under 35 U.S.C. 154(b) by 0 days.

(21) Appl. No.: 10/406,599

(22) Filed: Apr. 4, 2003

(30) Foreign Application Priority Data

Apr. 5, 2002 (GB) ............................................. 0207857

(51) Int. Cl.⁷ ...................... H01L 27/108; H01L 29/76; H01L 29/94; H01L 31/119
(52) U.S. Cl. ...................... 257/296; 257/303; 257/306
(58) Field of Search .......................... 257/68, 296, 303, 257/306, 528, 532

(56) References Cited

U.S. PATENT DOCUMENTS

| 5,166,858 A | 11/1992 | Frake et al. |
| 5,583,359 A | 12/1996 | Ng et al. |
| 5,739,576 A * | 4/1998 | Shirley et al. ............... 257/532 |
| 6,573,588 B1 * | 6/2003 | Kumamoto et al. ........ 257/532 |

FOREIGN PATENT DOCUMENTS

| EP | 0 285 854 | 10/1988 |
| JP | 10326863 A | 12/1998 |

* cited by examiner

*Primary Examiner*—Hoai Pham
(74) *Attorney, Agent, or Firm*—Squire, Sanders & Dempsey L.L.P.

(57) ABSTRACT

An integrated circuit capacitor and an integrated circuit are provided. The integrated circuit capacitor includes at least first, second and third conducting plates. The first conducting plate is positioned between the second and third plates. A first dielectric layer is positioned between the first and third conducting plates. A second dielectric layer is positioned between the first and second conducting plates. An "overlap portion" of the second conducting plate extends beyond the edge of the first conducting plate and towards the third conducting plate. The capacitor is arranged so that the electrical breakdown voltage between the overlap portion and the third conducting plate is lower than the electrical breakdown voltage between the first and second conducting plates.

16 Claims, 2 Drawing Sheets

Self protected capacitor schematic section

Self protected capacitor schematic section

Schematic section of capacitor using
well region as the diffused plate

Schematic sections of capacitor with extra metal plates

US 6,933,551 B1

LARGE VALUE, COMPACT, HIGH YIELDING INTEGRATED CIRCUIT CAPACITORS

BACKGROUND OF THE INVENTION

1. Field of the Invention

The invention relates to integrated circuit capacitors having integral protection from charging damage, and integrated circuits containing such capacitors.

2. Description of the Related Art

Reliable and highly yielding capacitors are a basic requirement for the creation of many types of electronic circuit. Modem technology allows the integration of many types of device on a single integrated circuit (IC) chip. Building capacitors on the IC chip may be a problem due to the interaction of the component with the process manufacturing equipment. Large RF fields and heavy influx of ions may cause the capacitor plates to become charged. Charge may leak very slowly from the capacitor but this may be at a slower rate than the arrival of more charge. As the charging continues the voltage increases until electrical breakdown of the capacitor dielectric occurs. This breakdown may cause catastrophic failure of the dielectric resulting in a short circuit between the capacitor plates which destroys the component. Very thin dielectrics are able to conduct more current before they become damaged.

The area used by capacitors is very large compared to other electronic components. Larger areas increase the size of the final integrated circuit and make it more costly to manufacture. Yields of an IC are dictated by the size. To reduce the area, the capacitance per unit area needs to be maximised. This is accomplished by creating capacitors from more than one physical conductor plate, with the plates stacked on top of each other. Dielectric layers between the plates must have the smallest possible thickness. This also changes the tolerance to high voltages between the plates because the breakdown voltage is proportional to the thickness of the dielectric. The plates are connected together in the final component so that the capacitance per unit area is maximised and the component has two connection terminals: plus and minus.

Using a combined layer capacitor, the problem of damage encountered through the fabrication process is increased because any charge on the topmost conductor plate must find a leakage, or breakdown path to the underlying wafer substrate. Charges that may pass through the lower dielectric without causing damage may destroy the dielectric situated above. The connections between the capacitor plates occurs late in the fabrication sequence, hence it is very difficult to arrange other devices which could connect to the plates and limit the voltage experienced by it. For example, other inventors have utilised reverse biased diodes, which are connected to each plate for this purpose. However the diode is only effective when physically connected to the plate at the metallisation stages of the device fabrication. Charging related voltage build-up occurring earlier (eg at implantation, resist strip and etch) are not avoided using this technique. The invention seeks to protect the device at these earlier stages.

It is desirable for large value, compact, high yielding integrated circuit capacitor to:

a) have a large capacitance per unit area;

b) utilise more than two conductor plates;

c) use very thin dielectric layers between the plates; and d) be able to survive device charging encountered during the fabrication process.

BRIEF SUMMARY OF THE INVENTION

According to the invention there is provided an integrated circuit capacitor, and an integrated circuit. The integrated circuit capacitor includes at least first, second and third conducting plates. The first conducting plate is positioned between the second and third plates. A first dielectric layer is positioned between the first and third conducting plates. A second dielectric layer is positioned between the first and second conducting plates. An "overlap portion" of the second conducting plate extends beyond the edge of the first conducting plate and towards the third conducting plate. The capacitor is arranged so that the electrical breakdown voltage between the overlap portion and the third conducting plate is lower than the electrical breakdown voltage between the first and second conducting plates.

BRIEF DESCRIPTION OF THE DRAWINGS

Embodiments of the invention will now be more particularly described, by way of example only, with reference to the accompanying drawings, in which.

DETAILED DESCRIPTION OF THE PREFERRED EMBODIMENTS

Figure 1:
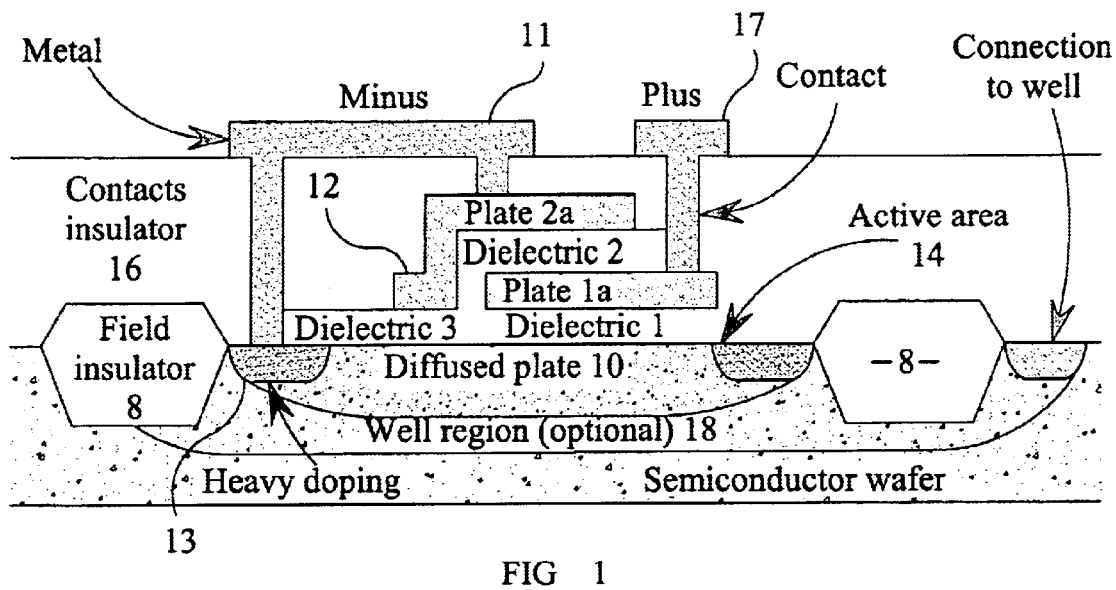
FIG. 1 shows a first embodiment of an integrated circuit capacitor incorporating features of the invention.

Referring to FIG. 1, a high value, robust capacitor may be made by first obtaining a substrate semiconductor material which may be silicon and defining a region (the active area) of thin dielectric (dielectric 1) surrounded by a thicker dielectric (field insulator) 8. The region of thinner dielectric (dielectric 1) is implanted with a dopant (eg arsenic) which creates a thin doped semiconductor layer of opposite carrier type to the underlying semiconductor material. The formation of the semiconductor junction acts to provide the bottom connection regions of the capacitor. In particular the thin heavier doped region (10) immediately below the thin dielectric 1 is used as part of the MINUS plate of the capacitor. In this description it is called the diffused plate (10).

Next a thin conductor layer (plate. 1a), which may be polysilicon is deposited on the wafer, doped with an impurity to make it a good electrical conductor and photolithographically printed and etched to form isolated regions of conductor. This conductive layer will form the PLUS plate of the capacitor.

A thin layer of dielectric (dielectric 2) is formed over the conductor plate 1a. This dielectric 2 is thicker than the first dielectric layer 1 (between the diffused plate 10 and the middle conductor 1a) and may be formed by a partial oxidation of the plate 1a if it is polysilicon, with a further deposited layer added to it.

Next a thin, second conductive layer (plate 2a), which may be polysilicon is deposited on the wafer, doped with an impurity to make it a good conductor and photolithographically printed and etched to form isolated regions of conductor. This second conductive layer 2a is positioned so that most of the conductor 2a is over the first conductive region 1a, except for a narrow region at the edge where connections may be made to the MINUS terminal 11.

Normally the topmost conductor 2a would be completely enclosed by the middle conductor 1a. However the self-protecting device described here requires that a small part 12 of the topmost conductor 2a is positioned so that it extends beyond the edge of the middle conductor 1a and overlaps the diffused plate conductive region 10. This region 12 is very small compared to the size of the capacitor plates (eg a narrow 1.5 µm strip of overlap into the diffused plate region 10). The overlap region 12 is isolated from diffused plate 10 by a thin layer of dielectric (dielectric 3). Dielectric 3 is thinner than dielectric 2. In another possible embodiment there is no dielectric 3 and the plate 2 overlaps, and short-circuits to, the diffused plate 10.

Once the plates are in place the structure is able to protect the capacitor from charging damage. Plate 1a is protected from damage due to the layer being almost entirely covered by plate 2a (except for the small area which is later used to connect to plate 1a.

If plate 2a becomes charged the voltage will rise until the voltage is sufficient to cause breakdown in the region 12 where plate 2a covers the diffused plate 10. This breakdown occurs before the plate 2a can destructively breakdown inside the main capacitor region between plates 1a and 2a because dielectric 3 is thinner than dielectric 2. Thinner dielectrics have lower breakdown voltages.

If the plate 2a is short-circuited to the diffused plate 10 then the plate 2a will be discharged through the short.

If the breakdown in the overlapped region 12 is destructive this does not break the final capacitor device. The reason is that the breakdown is between the plate 2a and the diffused layer 10 which will be connected together later to make the same electrical terminal. It is this use of a sacrificial, lower voltage breakdown area, which is later short circuited which forms an important part of this embodiment.

The capacitor may then be completed in the following way.

An implant 13 into the exposed active area region 14 on the wafer may be used to reduce connection resistance to the diffused plate 10.

The wafers are subjected to a thermal annealing cycle to electrically activate the implanted dopants.

After defining the capacitor plates the structure is covered with a thick dielectric layer (contacts insulator) 16. Connection holes to all the plates are printed and etched in the thick dielectric 16. A metal layer is deposited on the device, which connects to all the capacitor plates. This is patterned and etched to form the connection wires to the device and the rest of the circuit. In particular, the metal short circuits the diffused plate 10 to plate 2a (via MINUS terminal 11). The middle conductor plate 1a is connected to the PLUS terminal 17. A moderate temperature anneal step is used to sinter the metal connections to the capacitor plates and create low resistance connections.

The capacitance of the device is the sum of the capacitance of plate 1a to the lower diffused plate 10 and also to the upper plate 2a. Since both sides of the centre plate 1a are used the capacitance is much larger than a simple two-plate structure. The dielectric 1 between the diffused layer 10 and the middle conductor 1a can be very thin. The dielectric 2 layer must not be thinner than dielectric 3, otherwise the breakdown self-protective action will not function.

Several metal layers may be used to connect the capacitor wires into the circuit in a normal semiconductor integrated circuit fabrication process.

The semiconductor circuit is passivated with dielectric layers, sawn into chips and packaged into the final electrical components.

As shown in FIGS. 1 to 4, the capacitor may be created above an optional well region 18 of semiconductor which is doped to give an opposite doped semiconductor type compared to the wafer substrate type (eg the formation of a few micrometres deep p-well on an n-type silicon wafer). The well 18 may give an additional connection plate, which is isolated from the wafer substrate and the diffused plate 10 due to the semiconductor junctions. This optional plate 18 is useful to electrically shield the capacitor from effects such as substrate noise.

Figure 2:
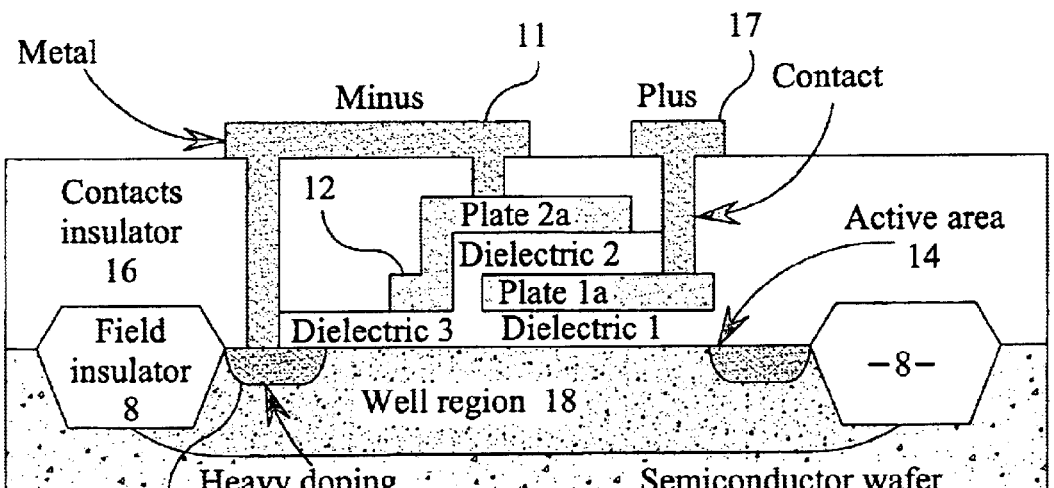
FIG. 2 shows a further embodiment which does not make use of a diffused plate.

FIG. 2 shows an alternative arrangement, in which the heavily doped diffused layer 10 is absent from the structure (perhaps because the process does not contain such a layer).

Instead the doping in the semiconductor well region 18 is used as the diffused plate. A highly doped implanted area 20 is used to connect to the well, but will be masked by the plate 1a region. A disadvantage of this arrangement is that the well doping is usually quite light and so carrier depletion of the semiconductor occurs when the capacitor is biased. This causes the capacitance to vary with applied voltage. Capacitors with heavier implants in the diffused plate have lower capacitance variation with voltage, since the depletion effect is less.

It is possible to utilise doped regions for diffused plate 10 and the optional well 18 which are the same doping type as the substrate material. In this case there is a connection disadvantage due to the MINUS terminal being shorted to the wafer substrate.

The diffused plate 10 and well 18 may optionally be doped the same type, but opposite to the substrate. This keeps the MINUS plate isolated from substrate, but the well 18 is then shorted to the diffused plate 10 and cannot be used to shield the device from the substrate.

Alternatively, the well 18 and substrate may be the same type with the diffused plate 10 oppositely doped. This also keeps the MINUS plate isolated from substrate but there is no shielding advantage in forming the well region because it is electrically shorted to the substrate.

Figure 3:
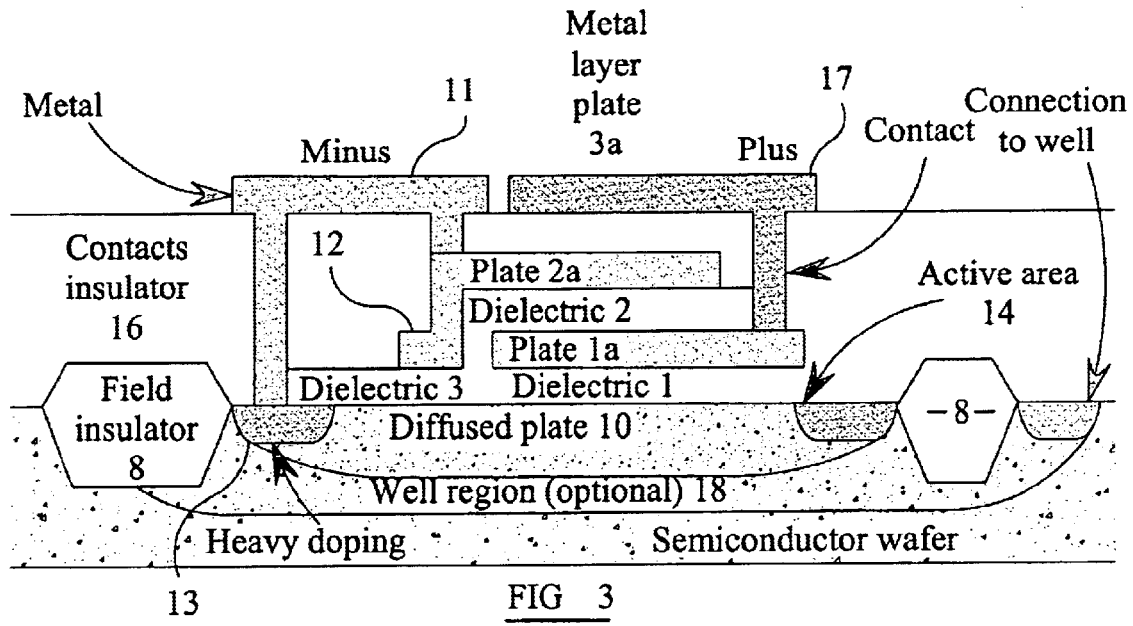
FIG. 3 shows a further embodiment in which a further conducting layer is provided in the form a metal plate extending from the PLUS terminal.
Figure 4:
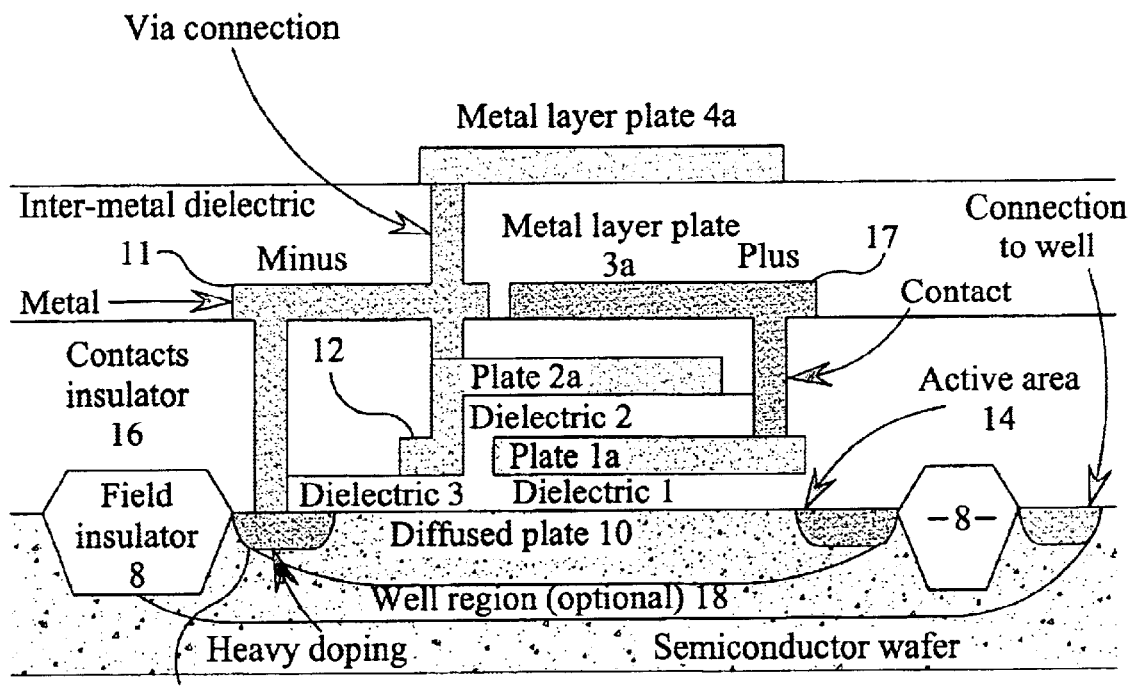
FIG. 4 shows a further embodiment in which a further conducting layer is provided in the form a metal plate extending from the MINUS terminal.

FIGS. 3 and 4 show that additional metal plates may be added above the capacitor structure and connected to the PLUS and MINUS terminals 11 and 17 to increase the capacitance per unit area further. For example, metal plates 3a and 4a may be added to the PLUS and MINUS terminals 11 and 17 respectively. The increase in capacitance per unit area will be dependent on the thickness of the inter-metal dielectric layer (which is usually thicker than the dielectric between plates 1a and 2a).

What is claimed is:

1. A capacitor for use in an integrated circuit the capacitor comprising:
    at least first, second and third conducting plates, the first conducting plate being positioned between the second and third plates;
    a first dielectric layer positioned between the first and third conducting plates; and
    a second dielectric layer positioned between the first and second conducting plates, wherein a portion, being an "overlap portion", of the second conducting plate extends beyond the edge of the first conducting plate and towards the third conducting plate, and the capacitor is arranged so that the electrical breakdown voltage between said overlap portion and the third conducting plate is lower than the electrical breakdown voltage between the first and second conducting plates, wherein a third dielectric layer is provided between said overlap portion and the third conducting plate, and the third dielectric layer is thinner than the second dielectric layer.

2. A capacitor as claimed in claim 1, wherein the third conducting plate is formed by doping a region of a semiconductor substrate.

3. A capacitor as claimed in claim 1, wherein the first dielectric layer is formed on top of a doped region of a semiconductor substrate.

4. A capacitor as claimed in claim 1, wherein the third conducting plate is a diffused plate formed by doping a layer of semiconductor substrate.

5. A capacitor as claimed in claim 1, wherein the first dielectric layer is surrounded by a thicker dielectric, acting as a field insulator.

6. A capacitor as claimed in claim 1, wherein the first and/or second conducting plates are formed from polysilicon.

7. A capacitor as claimed in claim 1, wherein the first conducting plate is connected to a plus terminal and the second and third conducting plates are connected to a minus terminal.

8. A capacitor as claimed in claim 7, wherein one or more metal plates extend from the plus and/or minus terminals in order to increase the capacitance of the capacitor.

9. A capacitor as claimed in claim 1, wherein conducting plates are covered by a thick dielectric layer through which holes are formed to make electrical connections to the conducting plates.

10. A capacitor as claimed in claim 1, wherein the capacitor is formed on a semiconductor substrate, and a portion of the substrate is doped to form a well region arranged to act as an additional connection plate.

11. An integrated circuit containing a capacitor as claimed in claim 1.

12. A capacitor for use in an integrated circuit, the capacitor comprising:

at least first, second and third conducting plates, the first conducting plate being positioned between the second and third plates;

a first dielectric layer positioned between the first and third conducting plates; and a second dielectric layer positioned between the first and second conducting plates, wherein a portion, being an "overlap portion", of the second conducting plate extends beyond the edge of the first conducting plate and towards the third conducting plate, and wherein the second conducting plate covers substantially the entire first conducting plate, except for an area of the first conducting plate which is for connection to a terminal of the capacitor, and the capacitor is arranged so that the electrical breakdown voltage between said overlap portion and the third conducting plate is lower than the electrical breakdown voltage between the first and second conducting plates.

13. A capacitor as claimed in claim 12, wherein a third dielectric layer is provided between said overlap portion and the third conducting plate, and the third dielectric layer is thinner than the second dielectric layer.

14. A capacitor as claimed in claim 12, wherein said overlap portion is connected directly to the third conducting plate.

15. A capacitor as claimed in claim 12, further comprising a said terminal, wherein the terminal is connected to the first conducting plate in said area.

16. A capacitor for use in an integrated circuit, the capacitor comprising:

at least first, second and third conducting plates, the first conducting plate being positioned between the second and third plates;

a first dielectric layer positioned between the first and third conducting plates; and a second dielectric layer positioned between the first and second conducting plates, wherein a portion, being an "overlap portion", of the second conducting plate extends beyond the edge of the first conducting plate and towards the third conducting plate, and the capacitor is arranged so that the electrical breakdown voltage between said overlap portion and the third conducting plate is lower than the electrical breakdown voltage between the first and second conducting plates, wherein the first conducting plate is connected to a first terminal and the second and third conducting plates are connected to a second terminal of a polarity which is opposite to the polarity of said first terminal, wherein at least one metal plate extends from one or both of the first and second terminals in order to increase the capacitance of the capacitor.

* * * * *